United States Patent [19]

Beun et al.

[11] Patent Number: 4,648,009
[45] Date of Patent: Mar. 3, 1987

[54] ARTICULATED LATCH FOR USE WITH A PRINTED CIRCUIT BOARD

[75] Inventors: Roger A. Beun, Dunrobin; Adrianus P. Van Gaal, Kanata, both of Canada

[73] Assignee: Northern Telecom Limited, Montreal, Canada

[21] Appl. No.: 849,620

[22] Filed: Apr. 9, 1986

[51] Int. Cl.⁴ .................................................. H05K 7/16
[52] U.S. Cl. ........................................ 361/399; 211/41;
339/45 M; 361/395; 361/412; 361/415
[58] Field of Search .................. 339/45 M; 211/41;
361/415, 412, 399, 395

[56] References Cited

U.S. PATENT DOCUMENTS

| T876,004 | 7/1970 | Andreini et al. | 339/45 R |
| 3,335,386 | 8/1967 | Upton | 339/45 M X |
| 3,451,034 | 6/1969 | Beale | 211/41 X |
| 3,691,430 | 9/1972 | Freitag | 361/415 |
| 3,784,954 | 1/1974 | Grimm et al. | 361/399 X |
| 3,798,507 | 3/1974 | Damon et al. | 317/101 |
| 3,952,232 | 4/1976 | Coules | 317/101 |
| 4,064,551 | 12/1977 | Lightfoot | 361/399 |
| 4,178,051 | 12/1979 | Kocher et al. | 339/45 M |
| 4,197,572 | 4/1980 | Aimar | 361/399 |
| 4,233,646 | 11/1980 | Leung et al. | 361/399 |
| 4,241,966 | 12/1980 | Gomez | 339/45 M |
| 4,313,150 | 1/1982 | Chu | 361/399 |
| 4,447,101 | 5/1984 | Gugliotti | 339/45 M |
| 4,564,250 | 1/1986 | Klein | 361/412 X |
| 4,569,001 | 2/1986 | Beun | 361/412 |
| 4,603,375 | 7/1986 | Miller et al. | 361/399 |
| 4,606,591 | 8/1986 | Bloch | 339/45 M |

Primary Examiner—R. R. Kucia
Attorney, Agent, or Firm—F. P. Turpin

[57] ABSTRACT

The invention provides an articulated latch for use with the faceplate of a printed circuit board (PCB) adapted to be inserted into and removed from its functional location on a mounting frame. The latch comprises an actuating member pivotally secured to a latching member adapted to be pivotally attached to the faceplate of a PCB. The actuating and latching members have an interface mechanism comprised of cooperating tab, slots, and wells for allowing the actuating member to lock at at least two positions into the latching member. With the PCB positioned in its functional location, the actuating member of the latch may be stored in an approximately horizontal position.

18 Claims, 10 Drawing Figures

U.S. Patent  Mar. 3, 1987  Sheet 1 of 3  4,648,009

ARTICULATED LATCH FOR USE WITH A PRINTED CIRCUIT BOARD

BACKGROUND OF THE INVENTION

The invention relates generally to latching levers for printed circuit boards and more particularly to an articulated latching lever.

It is conventional for printed circuit boards (PCBs) to be held in card holding frames so that the card contacts are inserted in mating connectors mounted on the frame. In order to obtain the necessary spacing from card to card, guide elements are provided which are secured to the frames in which the cards are slidably inserted. Since the mating connectors usually comprise a large number of connections, a substantial amount of force is necessary to provide for the insertion and removal of the mating portions of the connectors. The problem has been solved by providing the PCBs with one or more latching levers adapted to engage the PCB mounting frame to provide leverage thereby to reduce the amount of force to be exerted by a technician in the removal or insertion of a PCB in its frame.

Various prior art devices for performing this function are depicted in the following U.S. patents and attention is directed to them: U.S. Pat. No. 3,952,232 dated Apr. 20, 1976 to R. A. Coules, U.S. Pat. No. 3,798,507 dated Mar. 19, 1974 to N. F. Damon and H. G. Yeo; U.S. Pat. No. 4,064,551 dated Dec. 20, 1977 to R. Lightfoot; U.S. Pat. No. 4,313,150 dated Jan. 26, 1982 to Pak-Jong Chu; U.S. Pat. No. 4,233,646 dated Nov. 11, 1980 to E. C. Leung and I. R. Revah; and U.S. Defensive Publication No. T876,004 dated July 28, 1970 to J. Andreini et al. Another prior art device is pictured on pages 78 and 79 of the Fall 1975 Issue of Telesis published by Bell-Northern Research Ltd., Ottawa, Ontario, Canada.

All of these prior devices provide one or more latching levers for facilitating the removal, and in some cases, the insertion and retention of PCB connectors into and out of mating frame connectors.

For example, in the Lightfoot patent, a faceplate is secured to the front edge of a PCB. A pair of lever devices are mounted on the faceplate and the PCB. The latter is forced out by levering the faceplate away from the frame. If close packing of PCBs is paramount, it would seem appropriate to mount the levers directly to the PCBs thereby obviating the use of a faceplate. Such a device is disclosed in the Coules patent; however that device only assists in PCB removal.

Another example of prior art devices is described in the Telesis article identified above. In this case, the latching function is accomplished by a hooked portion of a lever that straddles the PCB and engages a pin mounted in the PCB. A handle, attached to the hooked portion of the device, enables the hooked portion to be disengaged from the pin thereby allowing the latching lever to pivot. The handle and hooked portion form one integral unit which is attached to the main body portion of the latching lever by a thin web of material. This thin web of material permits the latching lever to latch and to unlatch, but it is also a weak point in the latching lever in that the line of force, between the handle and the lever's pivot point, for pivoting the lever, is carried by the web. This problem is solved by the latching lever of the Leung et al patent which discloses a latching lever comprising a hooked portion flexibly connected to the body portion of the latching lever, an actuating member solidly connected to the hooked portion for moving the hooked portion relative to the body portion and a stop portion solidly connected to the body portion for limiting the movement of the actuating member. A stud carried by the PCB is engaged by the hooked portion of the lever to enable it to latch. Moving the actuating member disengages the hooked portion from the stud thereby unlatching the lever and leaving it free to pivot about its pivot point. Thus, the line of force, between the handle and the lever's pivot point, for pivoting the lever is carried by the stop portion and the body portion; it does not pass through the material by which the hooked portion is mounted to the body portion.

The present invention represents a radical departure from the known latching levers. The contemporary electronic equipment tends to be increasingly compact and one of the methods used to achieve compactness of packaging is to increase the depth of the shelves containing the PCBs. This packaging method allows the use of an additional set of PCBs mounted to the rear surface of the shelf backplane board. These PCBs are also held in card mounting frames including a faceplate and card guide elements mounted on the frame. The faceplate faces the rear of the cabinet and is usually adapted to receive connectors for interconnection of the shelf to other shelves and the outside world. Because of these connectors, the conventional known latches cannot be employed since they occupy or block off a large proportion of the faceplate.

The present invention solves this problem by providing a latch mechanism which, when operated, does not encroach on the space of adjacent shelves and in which the actuating member lies in a horizontal plane when the PCB is fully inserted in its slot.

SUMMARY OF THE INVENTION

In accordance with the invention, there is provided an articulated latch comprising an actuating member and a latching member. The latching member is adapted to be pivotally mounted to the faceplate on a PCB and the actuating member is pivotally attached to the latching member. The actuating and latching members have an interface mechanism comprised of cooperating tab, slots, and wells for allowing the actuating member to lock at at least two predetermined positions into the latching member. Hence, the PCB is inserted and removed from its full-in position with the actuatin9 member in one position and may be stored in a horizontal plane in a second locked position. In a preferred embodiment of the invention, the latching member is provided with a protruding stop member which locks in the PCB securely when the actuating member is in the stored position.

BRIEF DESCRIPTION OF THE DRAWINGS

An example embodiment of the invention will now be described in conjunction with the drawings in which.

DESCRIPTION OF THE PREFERRED EMBODIMENT

Figure 1:
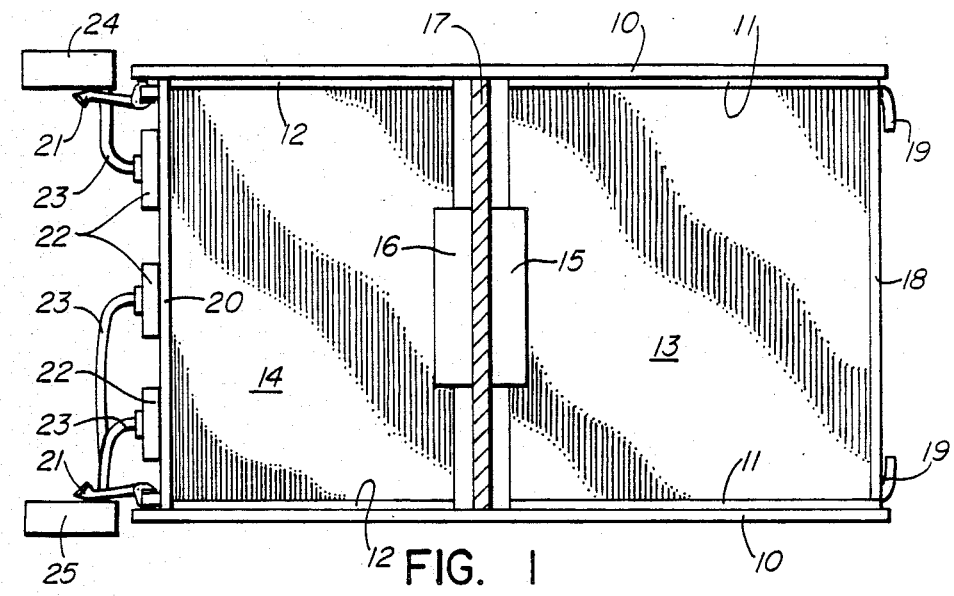
FIG. 1 is a pictorial side view of a shelf of electronic equipment illustrating a contemporary packaging method.

FIG. 1 illustrates a shelf of electronic equipment packaged using contemporary methods. A shelf frame 10 is held in an equipment frame (not shown) and supports a plurality of guide members such as 11 and 12 adapted to receive PCBs 13 and 14 respectively. PCBs 13 and 14 have respective connectors 15 and 16 for mating with cooperating connectors or rows of pins on a backplane 17. PCB 13 is attached to a faceplate 18 to which are secured a pair of latching levers 19 which may for example be of the type described in the Leung et al patent identified above. PCB 14 is mounted on a faceplate 20 on which are mounted a pair of articulated latches 21 and a plurality of connectors 22 from which cables 23 may run into shelf cable trays 24 and 25 also supported by the equipment frame.

Figure 2:
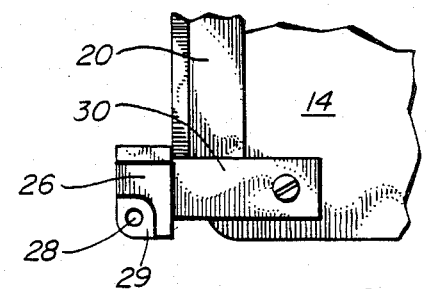
FIG. 2 is a side view of a front faceplate adapted for use with the articulated latch of the invention.
Figure 3:
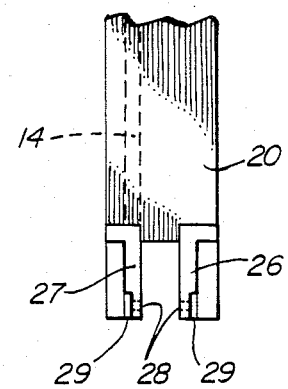
FIG. 3 is a front view of the front faceplate of FIG. 2.

FIGS. 2 and 3 show in detail one of the ends of faceplate 20 which is shown to have a pair of brackets 26 and 27 integrally formed therewith and adapted to receive a pivot pin in holes 28. The brackets may be provided with depressions 29 to receive the ends of a rivet when such is used as a pivot pin. The faceplate 20 is also shown to have a mounting tab 30 for mounting the PCB 14 and its bottom front surface terminates at the brackets 26-27.

Figure 4:
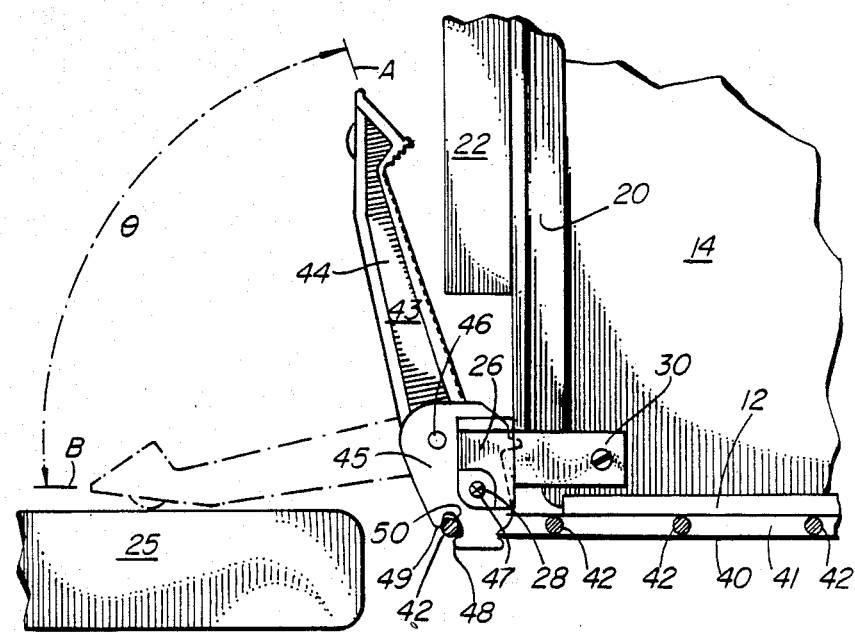
FIG. 4 is a side view of an articulated latch in accordance with the invention.

FIG. 4 provides an enlarged view of one of the articulated latches shown in FIG. 1 and illustrates its operation. Where possible, the labelling numerals are consistent between all the figures. The PCB 14 is supported in guide member 12 and is mounted to a faceplate 20 comprising brackets 26 and 27 having a pivot hole 28. The guide member 12 is secured to a shelf 40 of conventional design comprised of a rigid material and shaped in a rectangular grid pattern including longitudinal members 41 and cross-members 42. A cable tray 25, adapted to carry cables along the shelf, lies in a horizontal plane approximately level with that of shelf 40.

Attached to the brackets 26-27 is an articulated latch 43 comprising an actuating member 44 and a latching member 45. The actuating member 44 is pivotally attached to the latchin9 member 45 by a pivot pin 46 and the latter is attached to the faceplate 20 by a latching pivot pin 47. The actuating member 44 is adapted to lock into the latching member 45 at any one of two preset positions A or B. At the A position the actuating lever is in an almost vertical position and at position B, it lies in an almost horizontal position. The bottom portion of the latching member 45 is formed into a pair of hooks 48 and 49 to form an engagement cavity 50 adapted to receive one of the cross-members 42. The upper right portion of the latching member 45 has a projection 51 adapted to engage the bottom edge of the faceplate 20 when the latch is operated to insert the PCB 14 in its functional location, that is, when the connector 16 is fully mated with its counterpart on the backplane 17.

In operation, the latch is operative to insert and remove the PCB 14 from its functional location. The actuating member 44 may be locked into the latching member 45 at position A and rotated between its vertical and horizontal positions. As it is rotated downward, the latching member 45 rotates counterclockwise on pivot pin 47 and the hook 49 engages the cross-member 42. Further rotation of the latch 43 to the horizontal position forces the PCB 14 to slide away from the backplane 17 and the connector 16 becomes disengaged. At this point, the actuating member 44 is approximately horizontal and may rest on the cable tray 25 and the PCB 14 may be slipped out. The disengagement of the latching member 45 from the cross-member 42 is facilitated by providing the member with a pivot hole larger than the pivot pin 47 as discussed later. The insertion of PCB 14 into its functional location is achieved by pushing it into its location until the engagement cavity 50 is over the cross-member 42. With the actuating member 44 still locked into the latching member 45 at the A position, the member 44 is rotated clockwise to the vertical position causing the hook 48 to engage the cross-member 42 and forcing the PCB 14 into its functional position. At that point, the projection 51 of the latching member 45 engages the bottom edge of the faceplate 20. Ideally, the projection 51 has a slightly inclined face to force the bottom edge of the faceplate 20 to ride up thereon to absorb the dimensional tolerance of the loose pivot hole in the latching member 45. At this point, the actuating member may be unlocked from the latching member 45 and locked in its B or stored position. This causes the latching member 45 to remain securely locked against the faceplate 20 and removes the actuating member from the area of possible interference with the connectors 22 mounted on the faceplate 20. The degree of arc in the rotation of the actuating member 44 is preset by the internal structure of the latching member 45 as discussed below. It has been found that an arc of approximately 80° from the horizontal was adequate in this embodiment; of course, this amount may vary in accordance with the needs.

Figure 5:
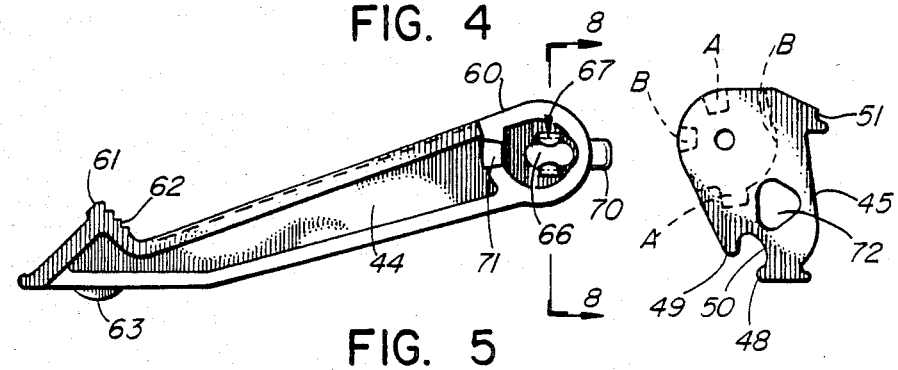
FIG. 5 is a side elevational view of the articulated latch of the invention.
Figure 6:
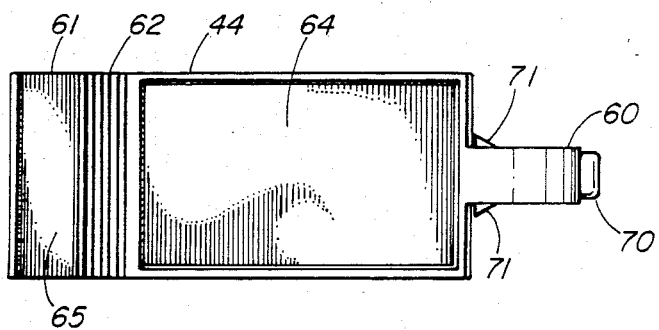
FIG. 6 is a top plan view of the actuating member of the articulated latch of FIG. 5.
Figure 7:
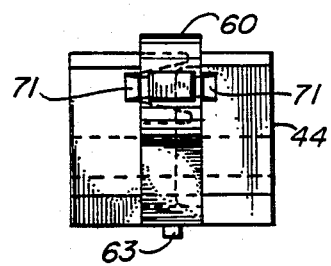
FIG. 7 is an side view of the actuating member of FIG. 6.
Figure 8:
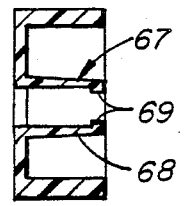
FIG. 8 is an view of the cross-section at 8—8 of FIG. 6.
Figure 9:
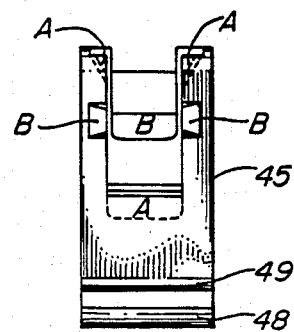
FIG. 9 is an end view of the latching member of FIG. 5.
Figure 10:
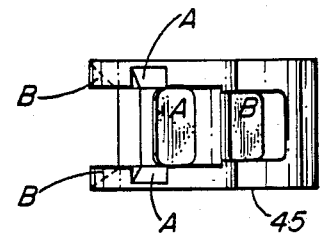
FIG. 10 is a top plan view of the latching member of FIG. 5.

FIG. 5 shows the actuating member 44 disassembled from the latching member 45 in order to show their internal construction. FIG. 6 is a top plan view of the actuating member 44 and FIG. 7 is an end view of the member 44 whereas FIG. 8 is an enlarged view of the detent mechanism of the member 44. FIGS. 8 and 9 illustrate the internal structure of the latching member 45.

The actuating member 44 comprises an elongated member having an annular portion 60 at the pivot end and a grasping handle 61 at the free end in order to facilitate the operation of the actuating member. The grasping handle 61 includes a corrugated surface 62 to provide a better grip. The underside of the member 44 is provided with a projection 63 adapted to maintain the free end of the actuating member 44 off a support surface such as cable tray 25 when the member is in the horizontal position. Ideally, the top surface of the actuating member 44 may be of the same width as the faceplate of the PCB in order to provide a substantial labelling surface 64. In this embodiment, the handle portion 61 provides a secondary labelling surface 65 which is sloped for easy reading when the actuating member is in the horizontal or stored position.

The annular portion 60 of the member 44 includes an elongaged slot 66 adapted to receive the pivot pin securing the member 44 to the latching member 45 and a detent mechanism 67 disposed about halfway between the ends of the slot 66. The detent mechanism 67 consists of a pair of fingers (FIG. 8) 68 having projections 69 towards the slot. As the actuating member 44 is moved towards and away from the latching member 45, the pivot pin securing them together moves from one end of the lot 66 to the other. The fingers 68 pinch the pivot pin as it passes the midway point of the slot 66 to provide tactile feedback to the operator and to bias the pivot pin at one or the other end of the slot 66. The annular portion 60 also comprises a generally rectangular tab 70 projecting out of the end, and a pair of projections 71, one on each side of the portion 60, diametrically disposed across the slot 66 from the tab 70.

As described above, the bottom portion of the latching member 45 is provided with a frame engagement cavity 50 formed by hook formations 48 and 49 and a stop projection 51 located at the upper right corner. The latching member is also provided with a cavity for receiving the annular portion 60 of the actuating member 44 including a pair of holes in the walls of the cavity for receiving a pivot pin 46. The inside bottom surface of the cavity has a pair of wells A and B, each one adapted to receive the tab 70. The outer edge of the inside walls of the cavity is provided with two pairs of slots A and B, each one diametrically disposed across the pivot holes 46. The slots A and B are adapted to receive the projections 71 on the annular portion 60 of the actuating member 44. Preferably, the projections 71 have converging sides and a sloped surface and the slots A and B on the inside surfaces of the latching member 45 have cooperating configurations to that of the projections 71. This structure alleviates the problem of binding between surfaces.

The latching member 45 is further provided with a pivot pin bearing hole 72 which is larger than the pivot pin 47 in order to absorb the dimensional tolerances of the latch, faceplate, frame, PCB and connector. Preferably the bearing hole 72 is generally triangular to provide ramps along which the pivot pin 47 glides during the insertion and removal of the PCB into and from its functional location.

The invention provides a PCB latch which is ideally suited for use with a rear mounted PCB since the latch actuator arm is away from the faceplate of the PCB in a horizontal position when the PCB is fully in place and locked. Of course, it may also be used on the front PCBs of a shelf. Also, a large variety of modifications from the described embodiment are possible without departing from the scope and spirit of the invention. For example, the pivot hole of the latching member need not be absolutely triangular. Similarly, the shape of the frame engagement means 50 and the stop projection 51 may vary depending on the type of frame and faceplate employed. Also, the shape and dimensions of the actuator arm may vary depending on the leverage needed, the space available, as well as other design choices.

What is claimed is:

1. An articulated latch for use with a faceplate of a printed circuit board adapted to be inserted into and removed from its functional location on a mounting frame, the latch comprising, an actuating member and a latching member, the actuating member being pivotally secured to the latching member and the later being adapted to be pivotally secured to the faceplate of the printed circuit board; the actuating and latching members having an interface mechanism comprised of cooperating tab, slots and wells for allowing the actuating member to lock at at least two positions into the latching member.

2. An articulated latch for use with a faceplate of a printed circuit board as defined in claim 1 wherein the latch is adapted to insert and remove the printed circuit board from its functional location with the actuating member locked into the latching member in one of said positions and to lie in an approximately horizontal plane with the actuating member locked in the other of said positions.

3. An articulated latch for use with a faceplate of a printed circuit board as defined in claim 2 wherein the latching member comprises an engagement means adapted to engage a portion of the mounting frame when the actuating member is in said one of said positions and the printed circuit board is inserted into and removed from its functional location.

4. An articulated latch for use with a faceplate of a printed circuit board as defined in claim 3 wherein the latching member further comprises a locking projection for engagement with the faceplate of the printed circuit board when the latter is fully inserted into its functional location.

5. An articulated latch for use with a faceplate of a printed circuit board as defined in claim 4 wherein the latching member is pivotally secured to the faceplate of the printed circuit board, the pivot hole of the latching member being substantially larger than the diameter of the pivot pin securing the latching member to the faceplate.

6. An articulated latch for use with a faceplate of a printed circuit board as defined in claim 5 wherein the bearing hole of the latching member is shaped like an equilateral triangle with rounded corners.

7. An articulated latch for use with a faceplate of a printed circuit board as defined in claim 1 wherein the interface mechanism between the actuating and latching members further comprises a resilient detent at the pivot point between the actuating and latching members for providing tactile feedback to an operator when the actuating member is locked and unlocked at any one of the two positions.

8. An articulated latch for use with a faceplate of a printed circuit board as defined in claim 7 wherein the pivot bearing hole of the actuating member is an elongated slot for allowing the member to move from the unlocked to the locked position, the resilient detent comprising a pair of resilient fingers located approximately midway along the slot and adapted to pinch the pivot pin as it passes from one extremity of the slot to the other in response to the locking and unlocking of the actuating member into the latching member.

9. An articulated latch for use with a faceplate of a printed circuit board as defined in claim 8 wherein the latching member is pivotaly secured to a pair of brackets projecting out from the faceplate.

10. An articulated latch for use with a faceplate of a printed circuit board as defined in claim 9 wherein the free end of the actuating member is shaped to provide a grasping handle to facilitate the in and out motion of the member.

11. An articulated latch for use with a faceplate of a printed circuit board as defined in claim 10 whereby the actuating member has a width approximately the same as the faceplate of the printed circuit board thereby providing a substantial labelling surface.

12. An articulated latch for use with a faceplate of a printed circuit board as defined in claim 11 wherein the grasping handle includes a triangular end portion thereby providing a sloped labelling surface with the actuating member lying in the horizontal plane.

13. An articulated latch for use with a faceplate of a printed circuit board as defined in claim 12 wherein the underside surface of the actuating member is provided with a projection adapted to maintain the free end of the actuating member off the support surface when the member is in the horizontal position.

14. An articulated latch for use with a faceplate of a printed circuit board as defined in claim 2 wherein the angular arc described by the actuating member between the first and second position is about 80°.

15. An articulated latch for use with a faceplate of a printed circuit board adapted to be inserted into and removed from its functional location on a mounting frame, the latch comprising, an actuating member and a latching member, the actuating member being pivotally attached to the latching member and the latter being adapted to be pivotally secured to the faceplate of the printed circuit board, the actuating member comprising an elongated portion forming a grasping handle at the free end thereof and an annular portion for attachment to the latching member, the annular portion comprising an elongated slot for receiving a pivot pin, a tab projecting out of the end and a pair of projections, one on each side of the annular portion, diametrically disposed across from the tab, the latching member having a hook portion for engagement with a portion of the mounting frame, and a cavity for receiving the annular portion of the actuating member including a pair of holes in the walls of the cavity for receiving the pivot pin, the bottom surface of the cavity having at least two wells, each one adapted to receive the tab of the actuating member, and the outer edge of the inside walls of the cavity having at least two pairs of slots each one diametrically disposed across the pivot holes from a respective one of said wells, the slots being adapted to receive the projections on the annular portion of the actuating member.

16. An articulated latch for use with a faceplate of a printed circuit board as defined in claim 15 wherein the annular portion of the actuating member further comprises a pair of resilient fingers located approximately midway along the elongated slot, the fingers being adapted to pinch the pivot pin as it passes from one end to the other of the slot.

17. An articulated latch for use with a faceplate of a printed circuit board as defined in claim 16 wherein the projections have converging sides and a sloped surface, and the slots on the inside surface of the latching member having cooperating configurations to that of the projections.

18. An articulated latch for use with a faceplate of a printed circuit board as defined in claim 17 wherein the angular arc between the pairs of slots on the inside surfaces of the latching member is about 80°.

* * * * *